(12) United States Patent
Lee

(10) Patent No.: US 6,232,813 B1
(45) Date of Patent: May 15, 2001

(54) PHASE LOCKED LOOP INTEGRATED CIRCUITS HAVING FUSE-ENABLED AND FUSE-DISABLED DELAY DEVICES THEREIN

(75) Inventor: Sang-bo Lee, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/419,837

(22) Filed: Oct. 15, 1999

(30) Foreign Application Priority Data

Oct. 19, 1998 (KR) .................................................. 98-43714

(51) Int. Cl.$^7$ .............................. H04L 7/08; H03H 11/26

(52) U.S. Cl. ........................ 327/278; 327/288; 327/276; 327/261; 327/158; 327/525

(58) Field of Search .................................... 327/261, 149, 327/158, 237, 236, 277, 276, 524, 288

(56) References Cited

U.S. PATENT DOCUMENTS

| | | | |
|---|---|---|---|
| 4,749,961 | 6/1988 | Kato et al. | 331/14 |
| 4,789,996 | 12/1988 | Butcher | 375/120 |
| 4,873,491 | 10/1989 | Wilkins | 328/155 |
| 5,229,752 | 7/1993 | Gliebe et al. | 340/658 |
| 5,336,939 | 8/1994 | Eitrheim et al. | 307/269 |
| 5,345,119 | 9/1994 | Khoury | 307/521 |
| 5,355,037 | 10/1994 | Andresen et al. | 307/602 |
| 5,394,022 | 2/1995 | Murakami et al. | 327/176 |
| 5,463,337 | 10/1995 | Leonowich | 327/158 |
| 5,544,203 | 8/1996 | Casasanta et al. | 375/376 |
| 5,554,945 | 9/1996 | Lee et al. | 327/105 |
| 5,642,082 | 6/1997 | Jefferson | 331/25 |
| 5,652,530 | 7/1997 | Ashuri | 326/93 |
| 5,655,113 | 8/1997 | Leung et al. | 395/552 |
| 5,663,665 | 9/1997 | Wang et al. | 327/3 |
| 5,673,005 | 9/1997 | Pricer | 331/1 R |
| 5,699,003 | 12/1997 | Saeki | 327/261 |
| 5,717,652 | 2/1998 | Ooishi | 365/233 |
| 5,745,011 | 4/1998 | Scott | 331/44 |
| 5,757,240 | 5/1998 | Boerstler et al. | 331/34 |

(List continued on next page.)

FOREIGN PATENT DOCUMENTS 2 308 250  6/1997  (GB) .

OTHER PUBLICATIONS

U.S. application No. 09/387,376, Lee et al., filed Aug. 31, 1999.

*Primary Examiner*—Dinh T. Le
(74) *Attorney, Agent, or Firm*—Myers Bigel Sibley & Sajovec

(57) ABSTRACT

Phase locked loop integrated circuits include a phase detection circuit, a variable delay device and a delay control circuit. The variable delay device and delay control circuit provide improved characteristics by increasing the signal frequency bandwidth of the delay locked loop integrated circuit in a preferred manner. The phase detection circuit is configured to perform the functions of comparing first and second periodic signals and generating a phase control signal (e.g., VCON1) having a first property (e.g., magnitude) that is proportional to a difference in phase between the first and second periodic signals. The delay control circuit is responsive to the phase control signal VCON1 and generates a delay control signal that is provided to the variable delay device. The delay control circuit may comprise a counter, a first comparator, a second comparator and a shift register. The variable delay device includes a variable delay line and a compensation delay device. The variable delay line may contain a string of unit delay devices and a string of switches that each have an input electrically coupled to an output of a corresponding unit delay device. Each of the unit delay devices in the string may provide a fixed delay or a variable delay that is influenced (e.g., increased) by changes (e.g., increases) in the magnitude of the phase control signal VCON1.

12 Claims, 5 Drawing Sheets

U.S. PATENT DOCUMENTS

| | | | |
|---|---|---|---|
| 5,828,250 | 10/1998 | Konno | 327/116 |
| 5,847,617 | 12/1998 | Reddy et al. | 331/57 |
| 5,877,656 | 3/1999 | Mann et al. | 331/16 |
| 5,886,946 | 3/1999 | Ooishi | 365/233 |
| 5,907,253 | 5/1999 | Davis et al. | 327/156 |
| 5,930,182 | 7/1999 | Lee | 365/194 |
| 6,115,836 * | 9/2000 | Churchill et al. | 714/261 |

* cited by examiner

PHASE LOCKED LOOP INTEGRATED CIRCUITS HAVING FUSE-ENABLED AND FUSE-DISABLED DELAY DEVICES THEREIN

RELATED APPLICATION

This application is related to Korean Application No. 98-43714, filed Oct. 19, 1998, the disclosure of which is hereby incorporated herein by reference.

FIELD OF THE INVENTION

The present invention relates to integrated circuit devices, and more particularly to integrated circuit devices containing phase locked loops and methods of operating same.

BACKGROUND OF THE INVENTION

Many integrated circuit devices (e.g., memory devices) operate in-sync with externally supplied clock signals by generating one or more internal clock signals that are preferably phase locked with the external clock signal and with each other. As will be understood by those skilled in the art, accurate phase locking of clock signals can be especially important for integrated circuit devices that operate a high frequencies. Such integrated circuit devices may include merged memory with logic (MML) devices, Rambus DRAM devices and double data rate synchronous DRAM devices (DDR-SDRAM).

Conventional techniques for providing clock signals across a relatively large integrated circuit chip typically suffer from an inability to accurately match clock signal phase, since clock signals traversing different length signal paths experience different signal delays (e.g., RC delays). These nonuniform delays make it difficult to accurate maintain synchronization of all devices on an integrated circuit chip. To address these limitations, many delay locked loop (DLL) integrated circuits generate advanced clock signals to compensate for the delays associated with signal path traversal. For example, FIG. 1 illustrates a conventional delay locked loop integrated circuit 10 that generates an advanced clock signal ADCLKD. This delay locked loop integrated circuit 10 includes a phase detector 12, a charge pump 14, a variable delay circuit 16 and a delay compensation circuit 18. The phase detector 12 receives a reference clock signal RCLK and a feedback clock signal (output on signal line 21 by the delay compensation circuit 18) and generates a pair of phase detected signals on signal lines 13a and 13b. These phase detected signals are provided to the charge pump 14 which generates a phase control signal (VCON1). This phase control signal VCON1 may have a magnitude that is proportional to a phase difference between the reference clock signal RCLK and the feedback clock signal.

The variable delay circuit 16 generates the advanced clock signal ADCLKD as a delayed version of the reference clock signal RCLK. As illustrated by FIG. 2, which is a block diagram of the variable delay circuit 16 of FIG. 1, the degree to which the advanced clock signal ADCLKD is delayed in time or phase relative to the reference clock signal RCLK is a function of the number of delay stages ST1–STn and the delay provided by each stage. As will be understood by those skilled in the art, the delay provided by each stage may be a function of the magnitude of the phase control voltage VCON1.

Unfortunately, the degree to which the delay provided by the variable delay circuit 16 of FIGS. 1–2 can be varied is limited by the fixed number of delay stages and the limited degree to which the delay of each stage can be varied in response to variations in the magnitude of the phase control signal VCON1. Such limited delay variation can increase the likelihood that the phase locked loop will experience jitter when high frequency and low frequency reference clock signals RCLK are used. Moreover, limited delay variation may make it difficult to control the timing and phase of such advanced clock signals to exactly match the delays associated with signal path traversal.

Thus, notwithstanding the delay locked loop integrated circuit of FIGS. 1–2, there continues to be a need for improved phase locked loop integrated circuits having greater signal frequency bandwidth and other improved characteristics.

SUMMARY OF THE INVENTION

It is therefore an object of the present invention to provide improved phase locked loop integrated circuits and methods of operating same.

It is another object of the present invention to provide phase locked loop integrated circuits having wide signal frequency bandwidth and methods of operating same.

It is still another object of the present invention to provide phase locked loop integrated circuits that can generate advanced clock signals having carefully controlled phase relationships and methods of operating same.

These and other objects, advantages and features of the present invention are provided by delay locked loop integrated circuits that preferably include a phase detector, a charge pump, a variable delay circuit and a delay compensation circuit. The phase detector receives a pair of periodic signals. These periodic signals may include a reference clock signal (e.g., RCLK) and a feedback clock signal (e.g., FDCLK). The phase detector compares the phase of the reference clock signal relative to the feedback clock signal and generates a pair of phase detected signals that each have a first property (e.g., pulse width) that is proportional to a difference in phase between the reference clock signal and the feedback clock signal. The charge pump performs the function of converting the pair of phase detected signals into a phase control signal (e.g., VCON2) having a magnitude proportional to the first property of the at least one of the phase detected signals.

The variable delay circuit receives the reference clock signal and the phase control signal and generates an advanced clock signal (e.g., ADCLKN) having a phase that leads the reference clock signal by an amount determined by the overall delay provided by the variable delay circuit. This advanced clock signal can be provided to other integrated circuit devices (e.g., memory devices) which may need to operate in-sync with the reference clock signal. Here, the advanced phase of the advanced clock signal relative to the reference clock signal can account for the timing skew or delay associated with providing the advanced clock signal to other devices and/or remote portions of an integrated circuit substrate. The delay compensation circuit may also add an additional fixed delay to the advanced clock signal. In particular, the sum of the delay provided by the delay compensation circuit and the variable delay circuit is preferably set at a value equal to an integer multiple of the period (T) of the reference clock signal, so that the feedback clock signal will be in-phase with the reference clock signal.

To meet these timing requirements, the delay provided by the variable delay circuit can be variably adjusted using preferred fuse-enabled and fuse-disabled delay stages. The fuse-disabled delay stage comprises a unit delay device and a disable control circuit having a disable fuse therein. The disable control circuit includes: a disable signal generating circuit, an output transmission gate electrically connected between an output of the unit delay device and an output of the fuse-disabled delay stage, an input transmission gate electrically connected between an input of the fuse-disabled delay stage and an input of the unit delay device; and a bypass transmission gate electrically connected between the input of the fuse-disabled delay stage and the output of the fuse-disabled delay stage. The fuse-enabled delay stage is similarly constructed and includes an enable fuse therein. Based on a preferred aspect of the present invention, one or more disable fuses or enable fuses within the variable delay circuit can be cut so that the overall delay provided by the variable delay circuit can be decreased or increased to establish a desired phase difference between the reference clock signal and the advanced clock signal. Preferred methods of operating phase locked loop integrated circuits are also provided by the present invention.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols.

Figure 1:
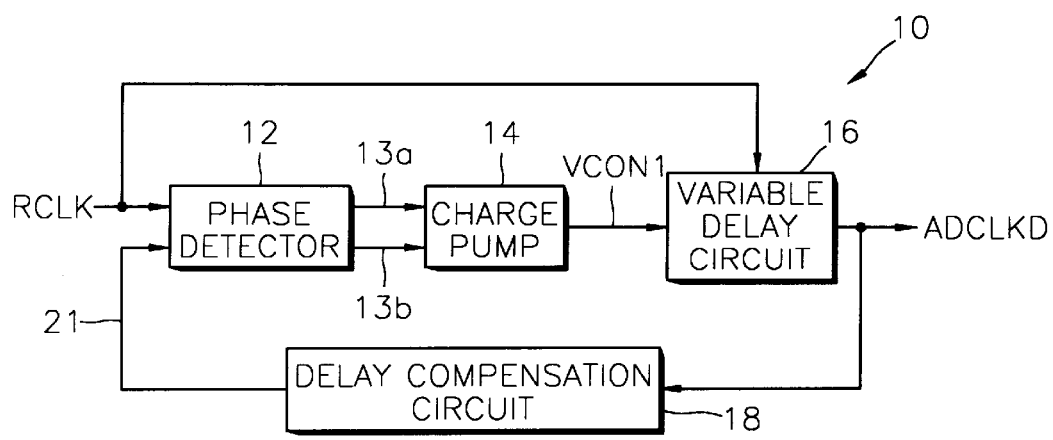
FIG. 1 is a block diagram of a conventional delay locked loop integrated circuit.
Figure 2:
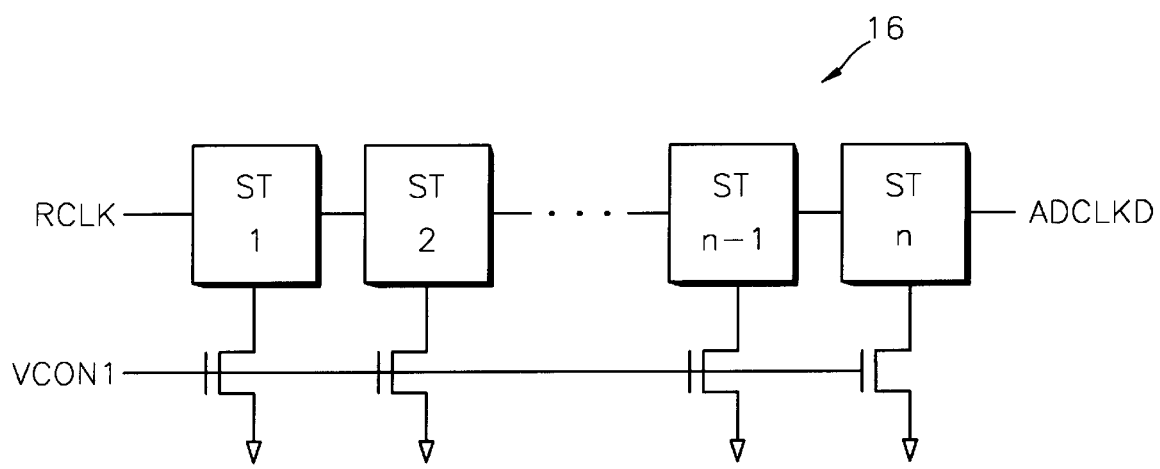
FIG. 2 is an electrical schematic of a variable delay circuit of FIG. 1.
Figure 3:
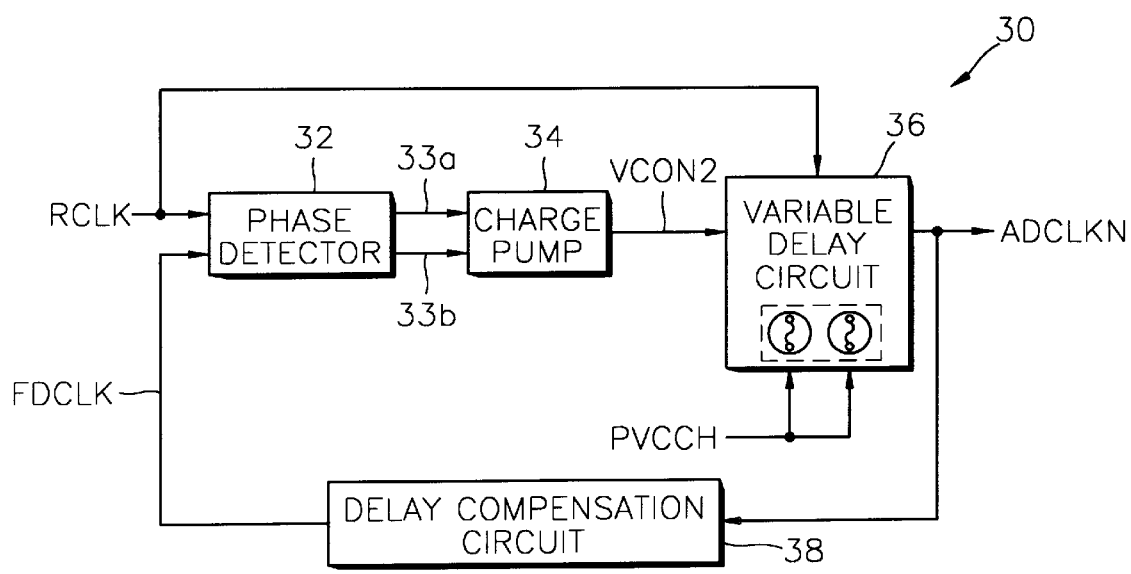
FIG. 3 is a block diagram of a delay locked loop integrated circuit according to an embodiment of the present invention.
Figure 4:
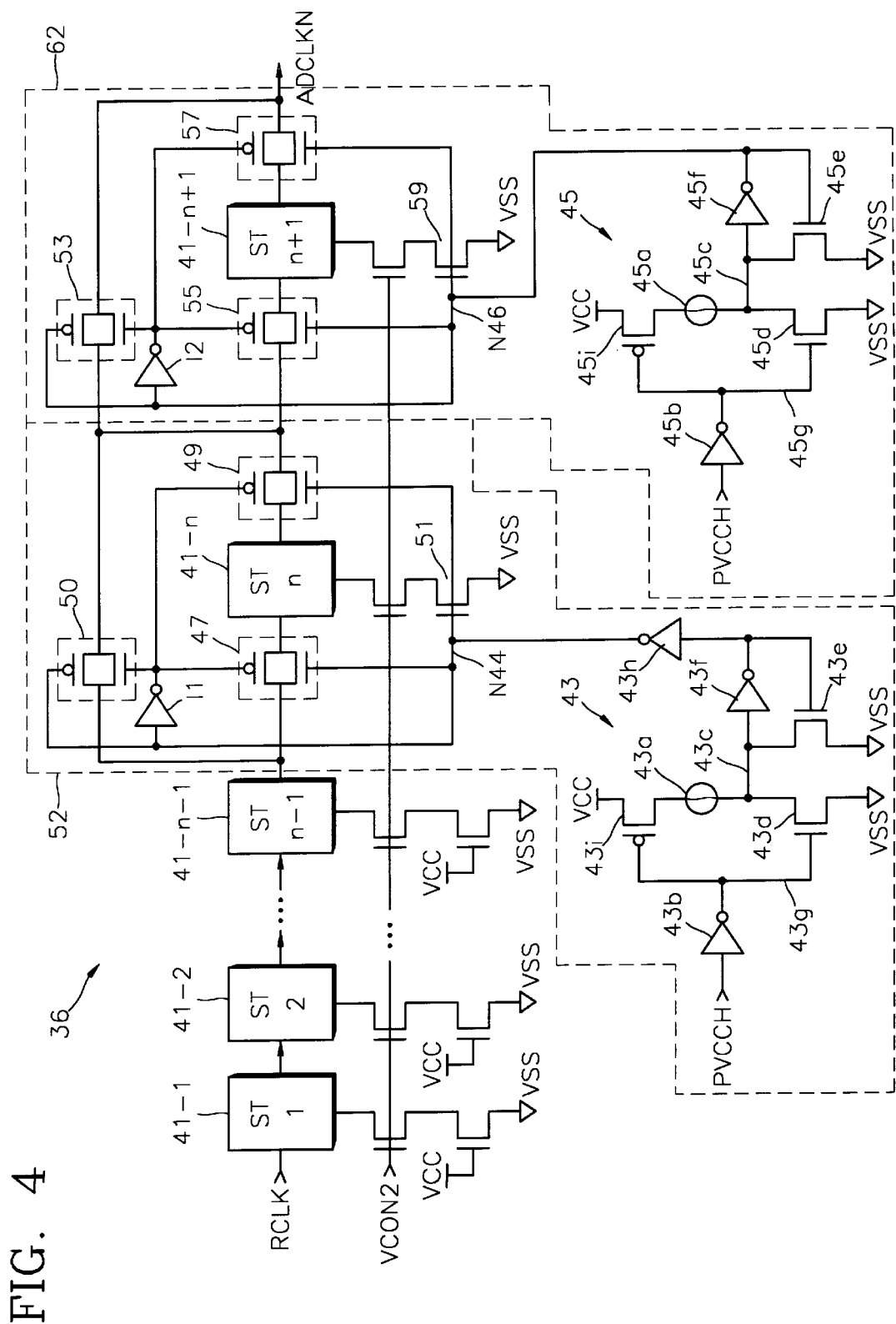
FIG. 4 is a preferred variable delay circuit of FIG. 3.

Referring now to FIGS. 3–4, preferred delay locked loop integrated circuits 30 according to the present invention will be described. In particular, FIG. 3 illustrates a preferred delay locked loop integrated circuit that includes a phase detector 32, a charge pump 34, a variable delay circuit 36 and a delay compensation circuit 38. As illustrated, the phase detector 32 receives a pair of periodic signals. These periodic signals may include a reference clock signal RCLK and a feedback clock signal FDCLK. The phase detector 32 compares the phase of the reference clock signal RCLK relative to the feedback clock signal FDCLK and generates a pair of phase detected signals that each have a first property (e.g., pulse width) that is proportional to a difference in phase between the reference clock signal RCLK and the feedback clock signal FDCLK. In particular, a first phase detected signal is generated on signal line 33a in the event the reference clock signal RCLK leads the phase of the feedback clock signal FDCLK, and a second phase detected signal is generated on signal line 33b in the event the reference clock signal RCLK lags the phase of the feedback clock signal FDCLK.

As will be understood by those skilled in the art, the charge pump 34 performs the function of converting the pair of phase detected signals into a phase control signal (VCON2) having a magnitude proportional to the first property of at least one of the phase detected signals. The overall delay provided by the variable delay circuit 36 may be a function of the magnitude of the phase control signal VCON2. These and other aspects of the present invention are more fully described in U.S. application Ser. No. 09/387,376, entitled "Phase Locked Loop Integrated Circuits Having Dynamic Phase Locking Characteristics and Methods of Operating Same", filed Aug. 31, 1999, assigned to the present assignee, the disclosure of which is hereby incorporated herein by reference.

Referring still to FIG. 3, the variable delay circuit 36 generates an advanced clock signal ADCLKN having a phase that leads the reference clock signal RCLK by an amount determined by the overall delay provided by the variable delay circuit 36. If the reference clock signal RCLK has a fifty percent (50%) duty cycle, then an advanced clock signal ADCLKN having a lagging phase delay in a range between 180° and 360° relative to the reference clock signal RCLK can also be treated as a signal that leads the reference clock signal RCLK by a leading phase amount in a range between 0° and 180°. Accordingly, if an appropriate delay is established by the variable delay circuit 36, then the advanced clock signal ADCLKN can be treated as being "advanced" in time and phase relative to the reference clock signal RCLK. This advanced clock signal ADCLKN can be provided to other integrated circuit devices (e.g., memory devices) which may need to operate in-sync with the reference clock signal RCLK. Here, the advanced phase of the advanced clock signal ADCLKN relative to the reference clock signal RCLK can account for the timing skew or delay associated with providing the advanced clock signal ADCLKN to other devices and/or remote portions of an integrated circuit substrate (e.g., chip). Preferably, the degree to which the advanced clock signal ADCLKN is advanced in phase relative to the reference clock signal RCLK equals the timing skew or delay associated with the clock signal lines that extend from the output of the variable delay circuit 36 to the input(s) of other potentially remote devices receiving the advanced clock signal ADCLKN.

The delay locked loop integrated circuit 36 also comprises a delay compensation circuit 38 that may provide a fixed delay to the advanced clock signal ADCLKN. In particular, the sum of the delay provided by the delay compensation circuit 38 and the variable delay circuit 36 is preferably set at a value equal to an integer multiple of the period (T) of the reference clock signal RCLK, so that the feedback clock signal FDCLK will be in-phase with the reference clock signal RCLK. To meet this timing requirement, the delay provided by the variable delay circuit 36 can be variably adjusted using preferred fuse-enabled and fuse-disabled delay stages, as described more fully hereinbelow with respect to FIG. 4.

Figure 5:
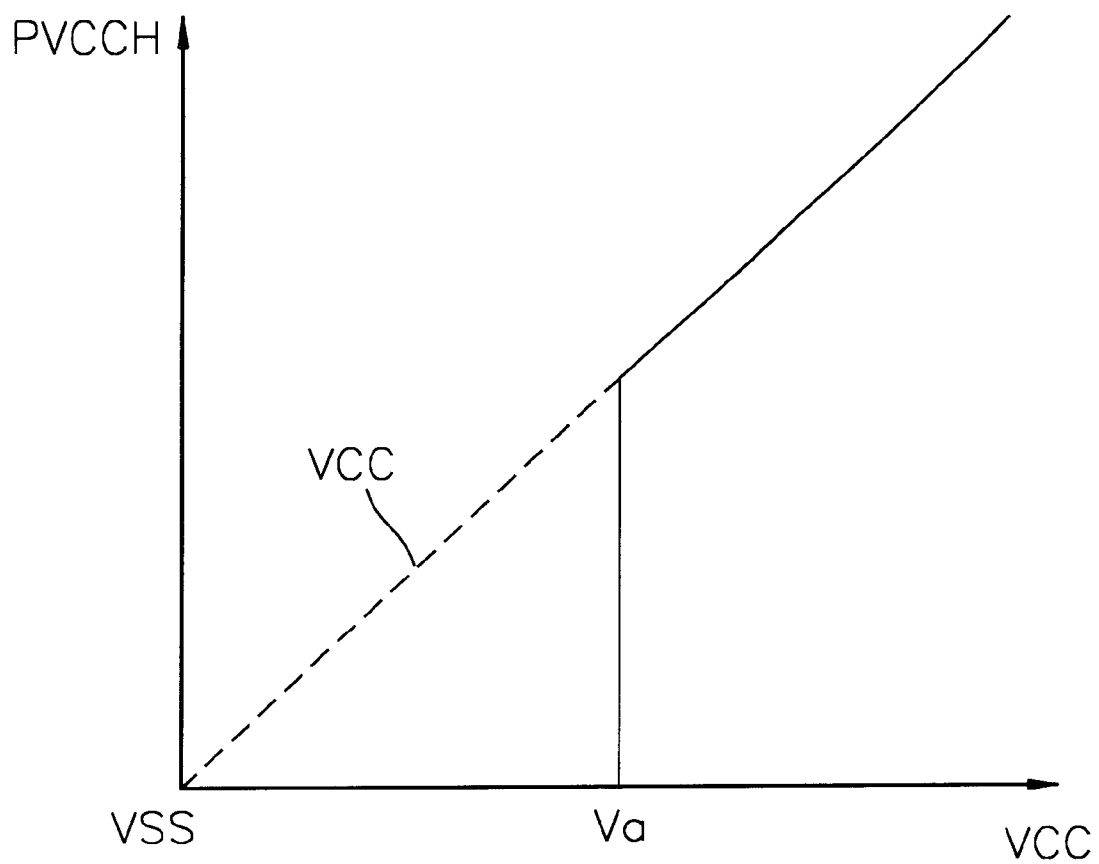
FIG. 5 is graph illustrating a voltage of a power-up signal PVCCH versus a power supply voltage VCC.

Referring now to FIGS. 4–5, the variable delay circuit 36 of FIG. 3 preferably comprises a plurality of unit delay stages 41-1, 41-2 to 41-n-1 that are electrically connected in series, as illustrated. A pair of serially-connected NMOS pull-down transistors are also provided within each unit delay stage. In particular, each pair of serially-connected NMOS transistors comprises a first NMOS pull-down transistor having a gate electrode that receives the phase control signal VCON2 and a second normally-on NMOS pull-down transistor having a gate electrode that receives a power supply signal Vcc. As will be understood by those skilled in the art, the delay provided by each unit delay stage in the plurality thereof may vary depending on the magnitude of the phase control signal VCON2 because the magnitude of this signal influences the on-state resistance of each of the first NMOS pull-down transistors. For example, an increase in the magnitude of the phase control signal VCON2 can cause a decrease in the delay of the unit delay stages 41-1, 41-2 to 41-n-1.

According to a preferred aspect of the present invention, the variable delay circuit 36 also includes at least one unit delay stage therein that is selected from a group that includes a fuse-enabled delay stage and a fuse-disabled delay stage. For example, the illustrated variable delay circuit 36 of FIG. 4 includes a fuse-disableddelay stage 52 and a fuse-enabled delay stage 62. The fuse-disabled delay stage 52 comprises a first unit delay device 41-n and a disable control circuit having a disable fuse 43*a* therein. The disable control circuit includes (i) a disable signal generating circuit 43, (ii) an output transmission gate 49 electrically connected between an output of the first unit delay device 41-n and an output of the fuse-disableddelay stage 52, (iii) an input transmission gate 47 electrically connected between an input of the fuse-disabled delay stage 52 and an input of the first unit delay device 41-n; and (iv) a bypass transmission gate 50 electrically connected between the input of the fuse-disabled delay stage 52 and the output of the fuse-disabled delay stage 52. An inverter I1 is also provided within the disable control circuit. As illustrated, the inverter I1 has an in put electrically connected to an output N44 of the disable signal generating circuit 43 and to the gate electrode of the NMOS pull-down transistor 51.

The disable signal generating circuit 43 comprises a plurality of inverters 43*b*, 43*f* and 43*h*, a plurality of NMOS transistors 43*d* and 43*e*, a PMOS transistor 43*i* and the disable fuse 43*a*. When the disable fuse 43*a* has not been cut, the PMOS transistor 43*i* and NMOS transistor 43*d* collectively form a first inverter having an output node 43*c* that is pulled up to a logic 1 level when a power-up signal PVCCH is set at a logic 1 level and pulled-down to a logic 0 level when the power-up signal PVCCH is set at a logic 0 level. The output N44. of the disable signal generating circuit 43 is also set at a logic 1 level when the output node 43*c* of the first inverter is held at a logic 1 level, and set to a logic 0 level when the output node 43*c* of the first inverter is held at a logic 0 level. Accordingly, when the disable fuse 43*a* is not cut, a logic 1 power-up signal PVCCH will cause the input transmission gate 47 and output transmission gate 49 to be turned on. When this occurs, the first unit delay device 41-n will provide an additional delay to the output of the plurality of unit delay stages 41-1, 41-2 to 41-n–1. However, when the disable fuse 43*a* is cut, the output node 43*c* of the first inverter will be pulled down to a logic 0 level upon start-up and then clamped at the logic 0 level (by action of the inverter 43*f* and NMOS pull-down transistor 43*e*). This pull down of the output node 43*c* occurs in response to a pull-up of the input node 43*g* to a logic 1 level. The input node 43*g* is pulled-up [00e6]because a logic 0 power-up signal PVCCH is initially generated at commencement of start-up. For example, as illustrated by FIG. 5, when the power supply voltage Vcc is at a level less than "$V_a$" at commencement of start-up, the power-up signal PVCCH is held at a logic 0 level. This pull down of the output node 43*c* will also cause the output N44 of the disable signal gener- ating circuit 43 to be pulled to a logic 0 level, the bypass transmission gate 50 to turn on, the input and output transmission gates 47 and 49 to turn off and the NMOS pull-down transistor 51 to turn off. Thus, cutting the disable fuse 43*a* causes the first unit delay device 41-n to be bypassed altogether.

Referring still to FIG. 4, the fuse-enabled delay stage 62 comprises a second unit delay device 41-n+1 and an enable control circuit having an enable fuse 45*a* therein. The enable control circuit includes (i) a enable signal generating circuit 45, (ii) an output transmission gate 57 electrically connected between an output of the second unit delay device 41-n+1 and an output of the fuse-enabled delay stage 62, (iii) an input transmission gate 55 electrically connected between an input of the fuse-delay stage 62 and an input of the second unit delay device 41-n+1; and (iv) a bypass transmission gate 53 electrically connected between the input of the fuse-enable delay stage 62, and the output of the fuse-enabled delay stage 62. An inverter 12 is also provided within the enable control circuit. As illustrated, the inverter 12 has an input electrically connected to an output N46 of the enable signal generating circuit 45 and to the gate electrode of the NMOS pull-down transistor 59.

The enable signal generating circuit 45 comprises a plurality of inverters 45*b* and 45*f*, a plurality of NMOS transistors 45*d* and 45*e*, a PMOS transistor 45*i* and the enable fuse 45*a*. When the enable fuse 45*a* has not been cut, the PMOS transistor 45*i* and NMOS transistor 45*d* collectively form a second inverter having an output node 45*c* that is pulled up to a logic 1 level when a power-up signal PVCCH is set at a logic 1 level and pulled-down to a logic 0 level when the power-up signal PVCCH is set at a logic 0 level. The output N46 of the enable signal generating circuit 45 is also set ata logic 0 level when the output node 45*c* of the second inverter is held at a logic 1 level, and set to a logic 1 level when the output node 45*c* of the second inverter is held at a logic 0 level. Accordingly, when the enable fuse 45*a* is not cut, a logic 1 power-up signal PVCCH will cause the input transmission gate 55 and output transmission gate 57 to be turned off and the bypass transmission gate 53 to be turned on. When this occurs, the second unify delay device 41-n+1 will be bypassed and will not provide any additional delay to the output of the plurality of unit delay stages 41-1, 41-2 to 41-n–1. However, when the enable fuse 45*a* is cut, the output node 45*c* of the second inverter will be pulled down to a logic 0 level upon start-up and then clamped at the logic 0 level (by action of the inverter 45*f* and NMOS pull-down transistor 45*e*). This pull down of the output node 45*c* occurs in response to a pull-up of the input node 45*g* (which occurs because a logic 0 power-up signal PVCCH is initially generated at commencement of start-up). This pull down of the output node 45*c* will also cause the output N46 to be driven to a logic 1 level, the bypass transmission gate 53 to turnoff, the input and output transmission gates 55 and 57 to turn on and the NMOS pull-down transistor 59 to turn on. Thus, cutting the enable fuse 45*a* causes the second unit delay device 41-n+1 to be included in the series delay path within the variable delay circuit 36.

Accordingly, by selectively cutting one or more disable fuses or enable fuses within the variable delay circuit 36, the overall delay provided by the variable delay circuit 36 can be decreased or increased to establish a desired phase difference between the reference clock signal ROLK and the advanced clock signal ADCLKN.

Figure 6:
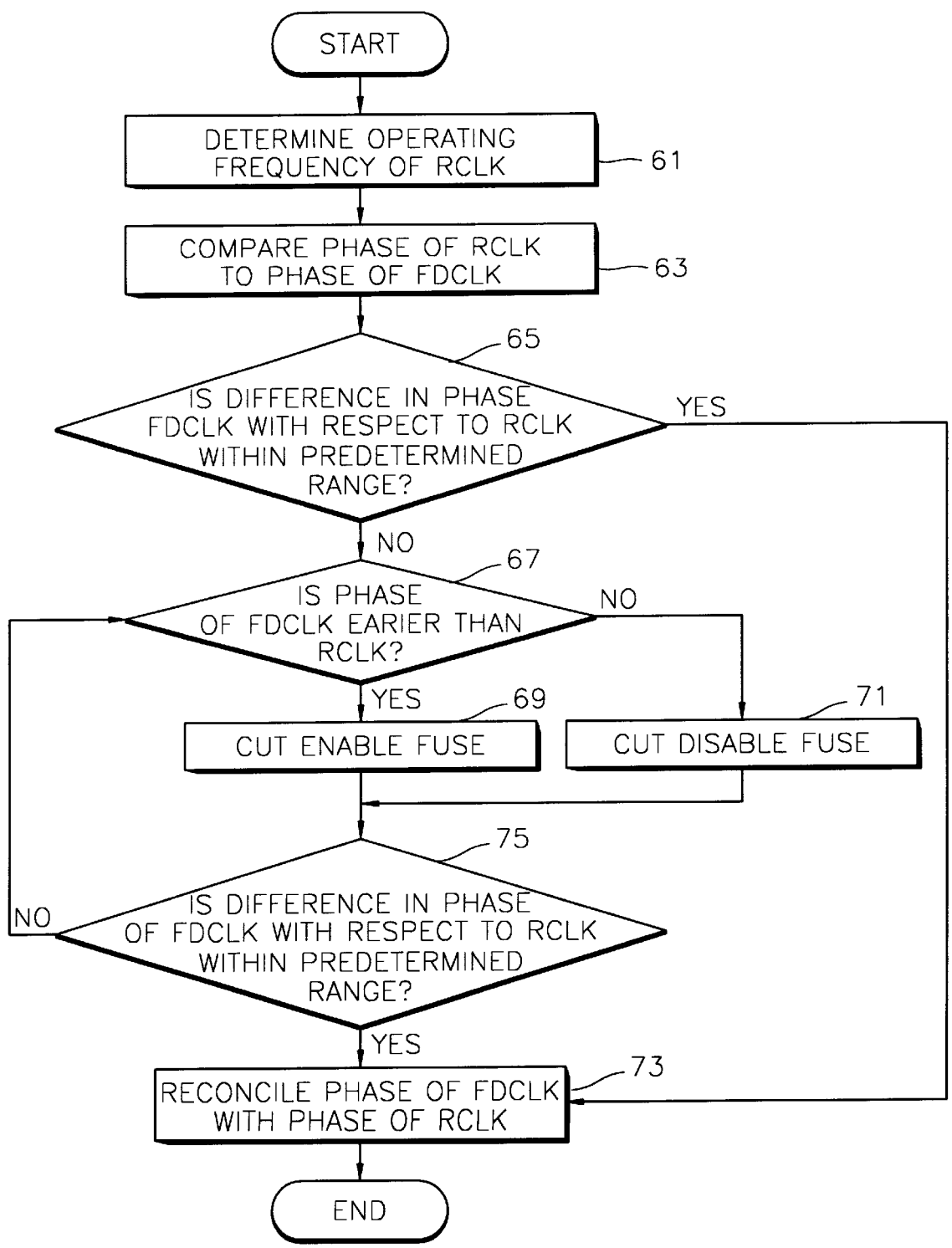
FIG. 6 is a flow diagram of steps that illustrates preferred methods of operating a phase locked loop integrated circuit according to the present invention.

Referring now to FIG. 6, preferred methods of operating the delay Locked loop integrated circuit of FIG. 4 will be described. As illustrated by Blocks 61 and 63, the operating frequency of the reference clock signal RCLK may be determined and the phase of the reference clock signal RCLK may be compared to the phase of the feedback clock signal FDCLK. Then, as illustrated by decision Block 65, a determination is made as to whether a difference in phase, between the reference clock signal ROLK and the feedback clock signal FDCLK is within a predetermined range. If so, the phase of the feedback clock FDCLK is reconciled with the phase of the reference clock signal RCLK, Block 73. However, if the difference in phase is not within the predetermined range, then another decision is made as to whether the phase of the feedback clock signal FDCLK is earlier than the reference clock signal RCLK, Block 67. If the phase of the feedback clock signal FDCLK is earlier, then an enable fuse is cut, Block 69, so that the delay provided by the variable delay circuit 36 can be increased. However, if the phase of the feedback clock signal FDCLK is not earlier, then a disable fuse is cut, Block 71, thereby shortening the delay provided by the variable delay circuit 36.

Another decision is then made to determine whether a difference in phase between the feedback clock signal FDCLK and the reference clock signal RCLK is now within the predetermined range, Block 75. If so, then the phase of the feedback clock FDCLK is reconciled with the phase of the reference clock signal RCLK, Block 73, and the method of operating the variable delay device 36 is complete. However, if the cutting of a single disable fuse or a single enable fuse does not cause the difference to fall within the predetermined range, then the steps at Blocks 67, 69, 71 and 75 are repeated until the desired phase difference is established. Accordingly, the present invention includes methods of operating the preferred delay locked loop integrated circuit by cutting a fuse within the fuse-enabled delay stage if a phase of the feedback clock signal FDCLK is earlier than a phase of the reference clock signal RCLK and cutting a fuse within the fuse-disabled delay stage if the phase of the feedback clock signal FDCLK is later than a phase of the reference clock signal RCLK.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A delay locked loop integrated circuit, comprising:
    a phase detector that compares a first periodic signal against a third periodic signal and generates at least one phase detected signal having a first property that is proportional to a difference in phase between the first periodic signal and the third periodic signal;
    a charge pump that converts the at east one phase detected signal into a phase control signal having a magnitude proportional to the first property of the at least one phase detected signal;
    a delay compensation circuit that generates the third periodic signal as a delay version of a second periodic signal; and
    a variable delay circuit that receives the phase control signal and the first periodic signal and generates the second periodic signal as a delayed-version of the first periodic signal, said variable delay circuit comprising a plurality of fuse independent delay stages, a fuse-enabled delay stage and a fuse-disabled delay stage connected together as a chain of delay stages, said fuse-disabled delay stage comprising a first unit delay device and a disable control circuit that bypasses the first unit delay device when a disable fuse therein is cut and said fuse-enabled delay stage comprising a second unit delay device and an enable control circuit that operates independent of a state of the disable fuse and precludes bypass of the second unit delay device when an enable fuse therein is cut but provides bypass of the second unit delay device when the enable fuse is not cut.

2. The circuit of claim 1, wherein the disable control circuit electrically connects an output of the first unit delay device to an output of the fuse-disabled delay stage when the disable fuse is not cut and electrically disconnects the output of the first unit delay device from the output of the fuse-disabled delay stage when the disable fuse is cut; and wherein the enable control circuit electrically connects an output of the second unit delay device to an output of the fuse-enabled delay stage when the enable fuse is cut and electrically disconnects the output of the second unit delay device from the output of the fuse-enabled delay stage when the enable fuse is not cut.

3. The circuit of claim 1, wherein a delay of the variable delay circuit changes in response to variations in magnitude of the phase control signal.

4. The circuit of claim 2, wherein said disable control circuit comprises:
    an output transmission gate electrically connected between the output of the first unit delay device and the output of the fuse-disabled delay stage;
    an input transmission gate electrically connected between an input of the fuse-disabled delay stage and an input of the first unit delay device; and
    a bypass transmission gate electrically connected between the input of the fuse-disabled delay stage and the output of the fuse-disabled delay stage.

5. The circuit of claim 4, wherein said disable control circuit comprises circuitry that drives a true gate of the input transmission gate, a true gate of the output transmission gate and a complementary gate of the bypass transmission gate at logic 1 levels when the disable fuse is not cut, and drives the true-gate of the bypass transmission gate, a complementary gate of the input transmission gate and a complementary gate of the output transmission gate at logic 1 levels when the disable fuse is cut.

6. The circuit of claim 5, wherein said disable control circuit comprises a CMOS inverter having PMOS pull-up transistor and an NMOS pull-down transistor; and wherein the disable fuse is electrically connected in series between a drain of the PMOS pull-up transistor and a drain of the NMOS pull-down transistor.

7. The circuit of claim 3, wherein said disable control circuit comprises:
    an output transmission gate electrically connected between the output of the first unit delay device and the output of the fuse-disabled delay stage;
    an input transmission gate electrically connected between an input of the fuse-disabled delay stage and an input of the first unit delay device; and
    a bypass transmission gate electrically connected between the input of the fuse-disabled delay stage and the output of the fuse-disabled delay stage.

8. The circuit of claim 7, wherein said disable control circuit comprises circuitry that drives a true gate of the input transmission gate, a true gate of the output transmission gate and a complementary gate of the bypass transmission gate at logic 1 levels when the disable fuse is not cut, and drives the true gate of the bypass transmission gate, a complementary gate of the input transmission gate and a complementary gate of the output transmission gate at logic 1 levels when the disable fuse is cut.

9. The circuit of claim 8, wherein said disable control circuit comprises a CMOS inverter having PMOS pull-up transistor and an NMOS pull-down transistor; and wherein the disable fuse is electrically connected in series between a drain of the PMOS pull-up transistor and a drain of the NMOS pull-down transistor.

10. A variable delay circuit, comprising:
   a plurality of fuse-independent delay stages, a fuse-enabled delay stage and a fuse-disabled delay stage connected together as a chain of delay stages;
   wherein said fuse-disabled delay stage comprises a first unit delay device and a disable control circuit that bypasses the first unit delay device when a disable fuse therein is cut; and
   wherein said fuse-enabled delay stage comprises a second unit delay device and an enable control circuit that operates independent of a state of the disable fuse and precludes bypass of the second unit delay device when an enable fuse therein is cut but provides bypass of the second unit delay device when the enable fuse is not cut.

11. The delay circuit of claim 10, wherein each of the delay stages in the chain are responsive to a control signal and are configured to provide a delay that is a function of a magnitude of the control signal.

12. The delay circuit of claim 11, further comprising first and second MOS transistors electrically connected in series between the first unit delay device and a reference potential; and wherein a gate of the first MOS transistor receives the control signal and a gate of the second MOS transistor receives a signal having a first logic state when the disable fuse is cut and a second logic state opposite the first logic state when the disable fuse is not cut.

* * * * *